United States Patent

[11] 3,615,932

[72] Inventors Tsugio Makimoto;
Michiyoshi Maki, both of Kodaira-shi, Japan
[21] Appl. No. 842,304
[22] Filed July 16, 1969
[45] Patented Oct. 26, 1971
[73] Assignee Hitachi, Ltd.
Tokyo, Japan
[32] Priority July 17, 1968
[33] Japan
[31] 43/50298

[54] METHOD OF FABRICATING A SEMICONDUCTOR INTEGRATED CIRCUIT DEVICE
6 Claims, 17 Drawing Figs.

[52] U.S. Cl. .......... 148/175, 29/576, 117/212, 148/187, 148/190, 148/191, 317/234, 317/235
[51] Int. Cl. .......... H01l 7/36, H01l 3/00, C23c 13/00
[50] Field of Search .......... 148/174, 175, 187, 188, 190, 191; 117/201, 212; 29/576, 578; 317/234, 235

[56] References Cited

UNITED STATES PATENTS

| | | | |
|---|---|---|---|
| 3,177,100 | 4/1965 | Mayer et al. | 148/175 |
| 3,183,129 | 5/1965 | Tripp | 148/186 |
| 3,341,755 | 9/1967 | Husher et al. | 317/235 |
| 3,451,867 | 6/1969 | Taft et al. | 148/175 |
| 3,477,886 | 11/1969 | Ehlenberger | 148/187 |
| 3,484,313 | 12/1969 | Tauchi et al. | 148/187 |

FOREIGN PATENTS

| | | | |
|---|---|---|---|
| 1,159,637 | 7/1969 | Great Britain | 148/187 |

*Primary Examiner*—L. Dewayne Rutledge
*Assistant Examiner*—W. G. Saba
*Attorney*—Craig, Antonelli, Stewart and Hill

ABSTRACT: A method of fabricating a semiconductor integrated circuit device in which a plurality of kinds of impurities for defining a collector wall region, a base region and an emitter region are simultaneously diffused by one heat treatment into an epitaxial layer formed on one surface of a semiconductor body with at least one region having a conductivity type opposite to that of the semiconductor body formed in the said one surface, the last named region becoming a part of a collector region, thereby largely reducing the rediffusion of an impurity in the last named region back into the base region to facilitate the control of the base width.

INVENTORS

TSUGIO MAKIMOTO and MICHIYOSHI MAKI

BY Craig, Antonelli, Stewart & Hill

ATTORNEYS

INVENTORS
TSUGIO MAKIMOTO and MICHIYOSHI MAKI

BY Craig, Antonelli, Stewart & Hill

INVENTORS
TSUGIO MAKIMOTO and MICHIYOSHI MAKI
BY Craig, Antonelli, Stewart & Hill
ATTORNEYS

METHOD OF FABRICATING A SEMICONDUCTOR INTEGRATED CIRCUIT DEVICE

The present invention relates to a method of fabricating a semiconductor integrated circuit device, and more particularly to a method of fabricating a transistor and/or resistor in an integrated circuit by simultaneously diffusing different kinds of impurities into an epitaxial layer having one conductivity type formed on one surface of a semiconductor body having a region of the opposite conductivity type in the same one surface.

As an example of the structure of a transistor in a semiconductor integrated circuit, one which is shown in FIG. 1 has been known, in which the collector region is constituted by an N-type region 11 formed in one surface of a P-type semiconductor body 10, and an N-type collector wall 13 formed by growing a P-type epitaxial layer 12 on the said one surface of the semiconductor body 10 and diffusing a donor impurity into the epitaxial layer 12, the base region consists of the portion 12*a* of the epitaxial layer 12 surrounded by the collector region 11 and 13, and the emitter region 14 consists of an N-type region 14 formed by diffusing an acceptor impurity into a surface portion of the base region 12*a*. Since the collector region of this transistor has a relatively high impurity concentration, the storage effect of minority carriers in the collector region can almost be ignored. Consequently, when a saturation type logical circuit such as a DTL (diode transistor logic), TTL (transistor transistor logic), RTL (resistor transistor logic) or the like is constructed by employing the above-mentioned structure of a transistor, a logical circuit with an excellent high-speed performance can be obtained since the storage time (ts) of an inverter transistor exerting much influence on the operation speed of the circuit can be markedly reduced.

However, the above-mentioned transistor has the disadvantage that since the collector buried region 11 having a relatively high impurity concentration is adjacent to the epitaxial layer 12 having a low impurity concentration and forming the base region 12*a*, the impurity included in the buried region is apt to rediffuse into the base region at the time of the heat treatment for impurity diffusion, and hence the control of the base width is difficult. According to the conventional method, the impurity diffusion for the formation of the collector wall 13 and the impurity diffusion for the formation of the emitter region 14 are carried out separately after the buried region 11 has been formed. Further, in case a transistor having a low base resistance is intended to be obtained, a further process of diffusing an acceptor impurity into the surface portion 15 of the base region 12*a* is necessary in addition to the above diffusion processes. Consequently, in the past it was difficult to obtain transistors having even base width, since the positions of the base regions widely vary due to long time heat treatments at high temperatures necessary for these impurity diffusion processes.

Therefore, it is an object of the present invention to provide a method of fabricating an integrated circuit device capable of reducing the time duration of the heat treatment for the impurity diffusion necessary after the formation of the above-mentioned buried region to facilitate the control of the base width.

According to the present invention there is provided a method of fabricating a semiconductor integrated circuit device having at least one transistor, comprising the steps of: forming at least one region having a first conductivity type in one surface of a semiconductor body having a second conductivity type which is opposite to said first conductivity type by diffusing a first impurity into said semiconductor body; forming an epitaxial layer having said second conductivity type on said one surface of said semiconductor body thereby making said region a buried region; forming an oxide film containing therein a second impurity determining said first conductivity type on said epitaxial layer, said oxide film having an opening located above said buried region whereby said oxide film is left in a frame configuration above the peripheral portion of said buried region; forming an oxide mask on said epitaxial layer covering said frame shaped oxide film, said oxide mask having an aperture located within said opening of said frame shaped oxide film; heating the resulting structure while supplying a third impurity determining said first conductivity type to cause said third impurity to diffuse into said epitaxial layer through said aperture of said oxide mask to form an emitter region while simultaneously causing said second impurity to diffuse from said frame shaped oxide film into said epitaxial layer to a depth reaching said buried region to form a collector wall region with an isolated base region of said epitaxial layer surrounded thereby, said third impurity being selected to be such a material as having a diffusion coefficient smaller than that of said second impurity to form said emitter region only in a surface portion of said epitaxial layer; and forming metal electrodes on respective surfaces of said emitter, collector wall and base regions.

As above, in the method of the present invention, a plurality of kinds of impurities are simultaneously diffused at one heat treatment into the epitaxial layer formed on the surface of the semiconductor body, in which surface at least one buried region has been formed. In this case, one of the said plurality of kinds of impurities, the second impurity which is to be diffused into the epitaxial layer to the extent that it reaches the buried region to form the collector wall region, has been contained in the oxide film deposited at low temperatures on the epitaxial layer.

The oxide film remains on the epitaxial layer formed in a frame shape suitable for forming the collector wall region. The oxide mask having an aperture for emitter diffusion is formed on the epitaxial layer covering the oxide film. Then, by heating the structure, another one of the said plurality of kinds of impurities, the third impurity, is diffused into the epitaxial layer through the aperture of the oxide mask to form the emitter region. Since during this heat treatment the second impurity having been contained in the frame shaped oxide film diffuses into the epitaxial layer, the diffusion coefficient of the third impurity should be selected to be smaller than that of the second impurity.

As described above, according to the present invention it is possible to diffuse different kinds of impurities into the epitaxial layer in predetermined patterns, respectively, during the time duration of heat treatment capable of making the variation of the buried region minimum by providing the second impurity being contained in the oxide film which can be formed at low temperatures on the epitaxial layer in a predetermined configuration. Consequently, the control of the base width is easier than by the conventional method. The "low temperatures" used in this specification means temperatures at which an impurity in the buried region does not rediffuse, i.e., in practice temperatures not higher than 900° C.

Further, according to the present invention, particularly when a transistor the base resistance of which is low is intended to be formed, a semiconductor body is subjected to heat treatment while being supplied with a fourth impurity having the same conductivity type as that of the base region, i.e., the second conductivity type as another one of the said plurality of kinds of impurities together with the third impurity. The fourth impurity is such one that can pass through the oxide mask and diffuse into the epitaxial layer. When it is required to selectively diffuse the fourth impurity into a restricted region only in the epitaxial layer, a second mask which can prevent the fourth impurity from passing therethrough is superimposed on the oxide mask on the upper or lower side thereof.

In order to make the features and effects of the present invention more apparent, typical embodiments of the present invention will next be described in detail with reference to the accompanying drawings. Although the following description will be made with regard to embodiments employing the fourth impurity for reducing the base resistance by way of explanation, it is to be noted that cases where such fourth impurity is not employed will easily be understood from the following embodiments.

Figure 1:
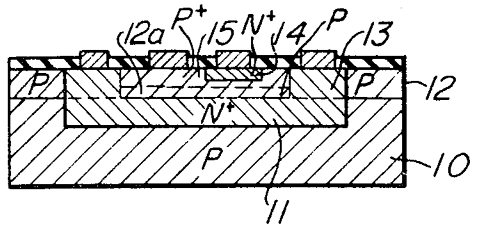
FIG. 1 is a cross-sectional view of a part of an integrated circuit device for illustrating the fundamental structure of a transistor relating to the present invention.
Figure 2:
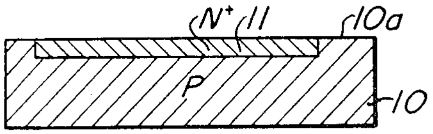
FIGS. 2 to 9 are cross-sectional views of a transistor in an integrated circuit at various steps of an embodiment of the fabricating method of the invention.

An embodiment of the method of the invention for fabricating the transistor of FIG. 1 will first be described with reference to FIGS. 2 to 9.

Figure 3:
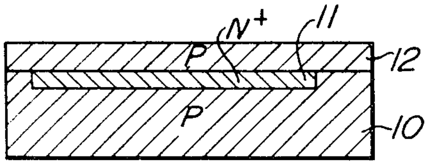
Figure 7:
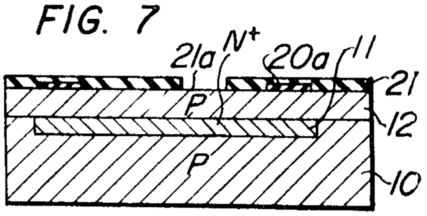

A semiconductor body 10 is, for example, of a P-type silicon single crystal having a resistivity of 10 to 100 ω·cm. doped with boron. The silicon body 10 has a flat surface 10*a* in a part of which is formed an N-type region 11 doped with antimony to a surface concentration of about $2\times10^{19}$ cm.$^{13}$. Since the N-type region 11 is relatively heavily doped, it is indicated in the FIGS. by the symbol $N^+$. The $N^+$ region 11 becomes a buried region when an epitaxial layer 12 is formed over the surface 10*a* of the silicon body 10 as shown in FIG. 3.

The epitaxial layer 12 is of the same conductivity type as that of the silicon body 10, i.e., P-type conductivity, and is formed by a well-known method, for example, by the method of hydrogen reduction of silicon halogenides. The epitaxial layer 12 is of about three microns in thickness, about $10^{17}$ cm.$^{13}$ in impurity concentration, and about 0.2 ω·cm. in resistivity, for example.

Figure 4:
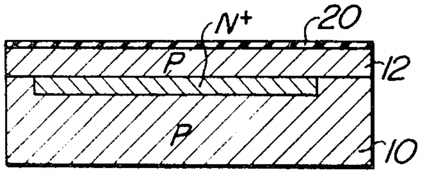

In the next step of the invention shown in FIG. 4, an oxide film 20 containing an N-type impurity is formed on the epitaxial layer 12. The oxide film 20 is an $SiO_2$ film formed by thermally decomposing monosilane ($SiH_2$) directed, together with an appropriate amount of oxygen and an N-type impurity, phosphorus, by a carrier gas, nitrogen, onto the silicon body provided with the epitaxial layer 12 heated to a "low temperature", about 400° C., in a reaction furnace. This thermal decomposition reaction is known as a chemical vapor deposition, and is characterized by a formation of an $SiO_2$ film at temperatures far lower than those of the thermal oxidization, and hence the diffusion of the buried region 11 hardly occurs during this reaction. The oxide film 20 is for diffusing the phosphorus contained therein into the epitaxial layer 12 to such a depth as will reach the N-type buried region 11 to form a collector wall region when the structure is later heated. The amount of the phosphorus contained in the oxide film 20 is controlled by the mixture ratio of the phosphorus gas and the monosilane gas fed into the reaction furnace.

Figure 5:
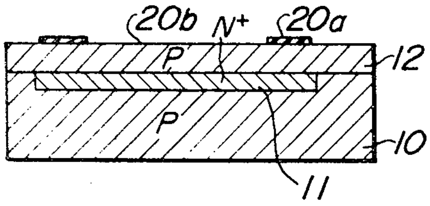

The phosphorus doped oxide film 20 is then subjected to a well-known photoetching process to form therein an opening 20*b* corresponding to a base region, leaving a frame shaped portion 20*a* above the peripheral portion of the buried region 11 as shown in FIG. 5.

Figure 6:
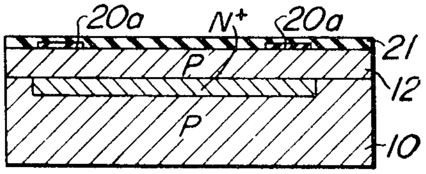

An oxide ($SiO_2$) film 21 is then formed over the frame shaped portion 20*a* of the phosphorus doped oxide film and the exposed area of the epitaxial layer 12 as shown in FIG. 6. This oxide film 21 serves as a surface protective film for circuit elements and as a mask for selective diffusion of an impurity. The oxide film 21 is formed, for example, by thermal decomposition of monosilane at relatively low temperatures. An aperture 21*a* for impurity diffusion for the formation of an emitter region is then formed in the oxide film 21 at a portion surrounded by the phosphorus doped oxide frame 20*a*.

Figure 8:
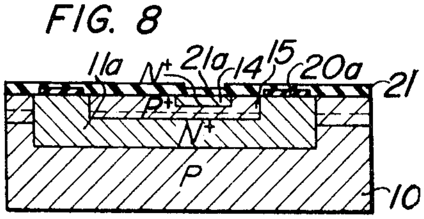

The resulting structure is then put in a closed tube along with solid gallium arsenide and heated at about 1,200° C. for about 25 minutes. By this heat treatment, gallium, a P-type impurity, arsenic, an N-type impurity, and phosphorus, an N-type impurity, contained in the oxide frame 20*a* diffuse into the epitaxial layer 12 as follows:

The gallium passes through the mask 21 due to its property of penetrating $SiO_2$ and diffuses into the surface of the epitaxial layer 12 to form a P-type region 15 having a low resistivity with a high concentration of a P-type impurity as indicated by the symbol $P^+$ in FIG. 8. The arsenic diffuses into the surface of the epitaxial layer 12 in the configuration conforming to the aperture 21*a* in the oxide mask 21 to form an N-type emitter region 14. The phosphorus diffuses into the epitaxial layer 12 in the configuration conforming to the phosphorus doped oxide frame 20*a* to form an N-type collector wall region 11*a*.

The reason why the depths of the N-type region 11*a*, the P-type region 15, and the N-type region 14 are different from each other despite the fact that they are formed by the same heat treatment is that the diffusion coefficients D(cm$^2$/sec) and the solid solubilities (atoms/cm$^3$) of the three kinds of impurities are different from each other. The diffusion coefficients and solid solubilities of the three kinds of impurities, phosphorus, arsenic and gallium, in silicon at 1,200° C. are as shown in table I. As seen from table I, since arsenic is smaller in its diffusion coefficient than those of phosphorus and gallium by about one order of magnitude although it is larger in its solid solubility than those of the others, the N-type region 14 formed thereby has the shallowest diffusion depth. Phosphorus and gallium are approximately the same in their diffusion coefficients. However, since the solid solubility of phosphorus is larger than gallium by about two orders of magnitude, phosphorus diffuses more deeply. Consequently, during the time that the P-type collector wall region 11*a* is formed to a depth of about 4 microns, the $P^+$base region 15 is formed to a depth of about 1.7 microns, and the N-type emitter region 14 is formed to a depth of about 1.3 microns in the above-mentioned heat treatment. Since the antimony included in the buried region 11 also diffuses back into the epitaxial layer 12 to a depth of about 0.7 micron during this heat treatment, the base width of the transistor becomes about 1 micron.

TABLE I

| | Diffusion Coefficient D (cm.$^2$/sec.) | Solid Solubility atoms/cm.$^3$) |
|---|---|---|
| P | $3\times10^{112}$ | $1.5\times10^{21}$ |
| As | $3\times10^{113}$ | $1.8\times10^{21}$ |
| Ga | $4\times10^{112}$ | $4\times10^{19}$ |

Figure 9:
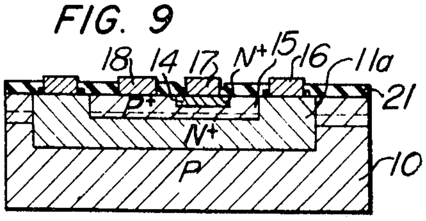
Figure 10:
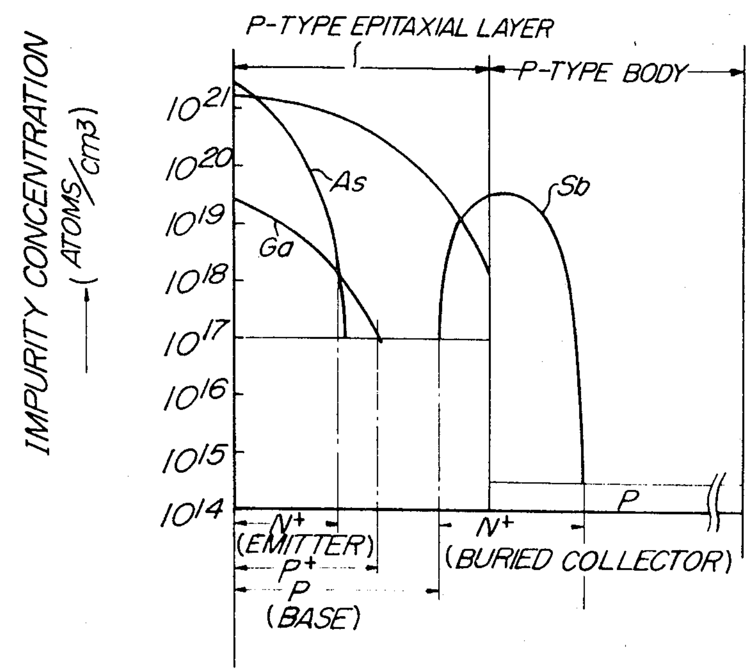
FIG. 10 is a graph showing the impurity distribution in the transistor of the embodiment of FIGS. 2 to 9.

The distributions of the diffused impurities in the semiconductor body are shown in FIG. 10 in which the abscissa represents the depth from the surface of the epitaxial layer 12 and the ordinate represents the impurity concentration. FIG. 9 shows the structure in which on the surfaces of the collector wall region 11*a*, emitter region 14 and base region 15 thus obtained metal electrodes 16, 17 and 18 are provided, respectively. The metal electrodes 16, 17 and 18 may be provided after the oxide films 21 and 20*a* are removed and instead a fresh oxide film is formed on the surface of the epitaxial layer 12.

It will be understood from the foregoing description that according to the present invention, since the rediffusion time of the impurity, antimony, included in the buried region 11 is very short, and moreover since the rediffusion is effected only once, the diffusion length is short and the control thereof is easy, resulting in an exact control of the base width.

Figure 11:
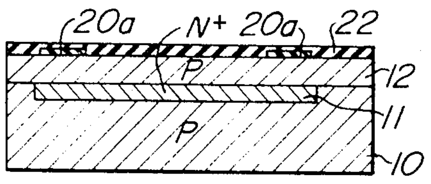
FIGS. 11 to 15 are cross-sectional views of a transistor in an integrated circuit at various steps of another embodiment of the fabricating method of the invention.

FIGS. 11 to 15 show another embodiment of the present invention in which the diffusion of an impurity for the reduction of the base resistance is limited only in the surface of the base region. The processes shown in FIGS. 11 to 15 can be substituted for those shown in FIGS. 6 to 8. In this embodiment, after the impurity doped oxide frame 20*a* is formed in the pattern for forming the collector wall region 11*a* on the P-type epitaxial layer 12 as shown in FIG. 5, a gallium obstructing film 22 is formed on the epitaxial layer 12 as shown in FIG. 11.

Figure 12:
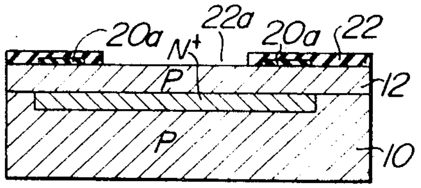

The gallium obstructing film 22 serves as a mask for selectively diffusing gallium into the epitaxial layer 12. For this purpose, an aperture 22a is formed in the film 22 at a position surrounded by the oxide frame 20a as shown in FIG. 12. Silicon nitride is an effective material for the gallium obstructing film 22. A silicon nitride film can be formed, for example, by directing a monosilane gas diluted to approximately 4 percent with nitrogen gas along with ammonia gas by employing nitrogen as a carrier gas onto the silicon epitaxial layer 12 heated to approximately 850° C. in a reaction furnace. At the temperature at which the silicon nitride film 22 is formed, the rediffusion of impurities from the buried region 11 or oxide frame 20a hardly occurs.

Figure 13:
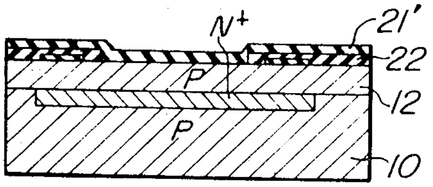
Figure 14:
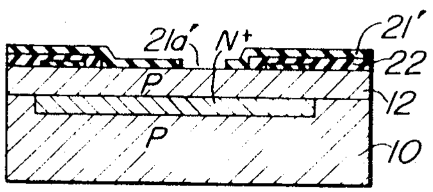
Figure 15:
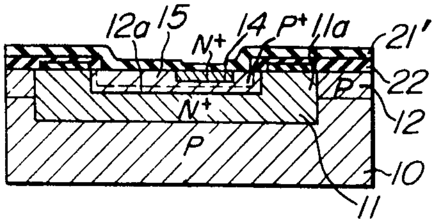

FIG. 13 shows the structure in which an oxide film 21' is provided over the nitride film 22, and FIG. 14 shows the structure in which an aperture 21a' for emitter diffusion is formed in the oxide film 21'. The oxide film 21' corresponds to the oxide film 21 shown in FIG. 6. Consequently, a transistor structure having a low resistivity region 15 only within a base region 12a as shown in FIG. 15 can be obtained by diffusing a P-type impurity, gallium, and an N-type impurity, arsenic, through the films 21' and 22 into the epitaxial layer 12.

The transistor thus obtained is, because the collector region 11 and 11a is adjacent to the base region 12a consisting of a high resistivity epitaxial layer, superior in its breakdown characteristics to the transistor obtained by the method of the first embodiment.

Incidentally, it is to be noted that the order of formation of the gallium obstructing film 22 and the oxide film 21° may be interchanged in the second embodiment.

The technique in which a P-type low resistivity region is selectively formed in a surface portion of a P-type epitaxial layer by employing a gallium obstructing film can be applied also to the formation of circuit components in semiconductor integrated circuits other than transistors. Two examples thereof will next be described with reference to FIGS. 16 and 17.

Figure 16:
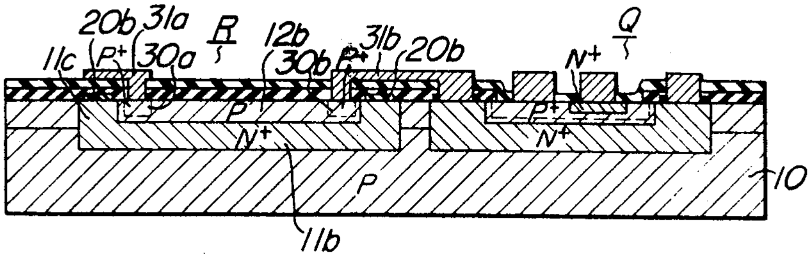
FIG. 16 is a cross-sectional view of an integrated circuit fabricated according to the method of the invention.

FIG. 16 shows a part of an integrated circuit device having a transistor Q and a resistor R in a silicon body. The resistor R is isolated by a frame shaped N-type isolation wall 11c formed by diffusing an impurity from a phosphorus doped oxide film 20b into a part of an epitaxial layer 12b and a previously provided N-type buried region 11b, and is provided with low resistivity contact regions 30a and 30b formed by diffusing gallium into surface portions of the P-type epitaxial layer 12b and metal electrodes 31a and 31b contacting with the contact regions 30a and 30b, respectively. The resistance of the resistor R depends on the configuration of the oxide film 20b because the resistance is defined by the geometry of the epitaxial layer region 12b.

Figure 17:
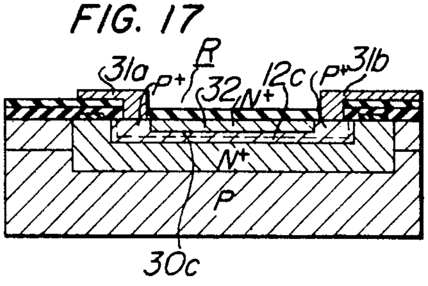
FIG. 17 is a cross-sectional view of a resistor in an integrated circuit fabricated according to the method of the invention.

FIG. 17 shows structure of resistor R. In this example, a P-type region 30c diffused with gallium and an N-type region 32 diffused with arsenic are formed in a superimposed relation in a surface portion of an epitaxial layer region 12c. The P-type region 30c having a narrow cross section between electrodes 31a and 31b is employed as the resistor region.

What is claimed is:

1. A method of fabricating a semiconductor integrated circuit device having at least one transistor, comprising the steps of:

forming at least one region having a first conductivity type in one surface of a semiconductor body having a second conductivity type which is opposite to said first conductivity type by diffusing a first impurity into said semiconductor body;

forming an epitaxial layer having said second conductivity type on said one surface of said semiconductor body thereby making said region a buried region;

forming an oxide film containing therein a second impurity determining said first conductivity type on said epitaxial layer, said oxide film having an opening located above said buried region whereby said oxide film is left in a frame configuration above the peripheral portion of said buried region:

forming an oxide mask on said epitaxial layer covering said frame shaped oxide film, said oxide mask having an aperture located within said opening of said frame shaped oxide film;

heating the resulting structure while supplying a third impurity determining said first conductivity type to cause said third impurity to diffuse into said epitaxial layer through said aperture of said oxide mask to form an emitter region while simultaneously causing said second impurity to diffuse from said frame shaped oxide film into said epitaxial layer to a depth reaching said buried region to form a collector wall region with an isolated base region of said epitaxial layer surrounded thereby, said third impurity being selected to be such a material as having a diffusion coefficient smaller than that of said second impurity to form said emitter region only in a surface portion of said epitaxial layer; and forming metal electrodes on respective surfaces of said emitter, collector wall and base regions.

2. A method of fabricating a semiconductor integrated circuit device according to claim 1, in which said frame shaped oxide film and oxide mask are formed by chemical vapor deposition of silicon compounds at low temperatures.

3. A method of fabricating a semiconductor integrated circuit device according to claim 1, in which said semiconductor body consists of a silicon monocrystal having N-type conductivity, said second impurity is phosphorus, and said third impurity is arsenic.

4. A method of fabricating a semiconductor integrated circuit device according to claim 1, in which said heat treatment is carried out while supplying a fourth impurity determining said second conductivity type together with said third impurity, said fourth impurity being capable of penetrating through said oxide mask into said epitaxial layer thereby reducing the resistivity of the surface portion of said base region.

5. A method of fabricating a semiconductor integrated circuit device according to claim 4, further comprising the step of forming a second mask on said surface of said epitaxial layer prior to said step of heating said structure, said second mask being of such a material that prevents said fourth impurity from penetrating therethrough and having an aperture located within said opening of said frame shaped oxide layer, said aperture of said first mask being positioned within said aperture of said second mask, thereby diffusing said fourth impurity into a limited surface portion of said base region.

6. A method of fabricating a semiconductor integrated circuit device according to claim 5, in which said semiconductor body consists of a silicon monocrystal having N-type conductivity, said second impurity is phosphorus, said third impurity is arsenic, said second mask is formed of silicon nitride, and said fourth impurity is gallium.

* * * * *